United States Patent
Sias et al.

(10) Patent No.: US 12,132,291 B2
(45) Date of Patent: Oct. 29, 2024

(54) EXTERNAL-CAVITY LASER DEVICE, CORRESPONDING SYSTEM AND METHOD

(71) Applicants: LABORATORIO EUROPEO DI SPETTROSCOPIE NON LINEARI (LENS), Sesto Fiorentino (IT); ISTITUTO NAZIONALE DI RICERCA METROLOGICA (I.N.RI.M.), Turin (IT)

(72) Inventors: Carlo Sias, Sesto Fiorentino (IT); Lucia Duca, Sesto Fiorentino (IT); Elia Perego, Sesto Fiorentino (IT)

(73) Assignees: LABORATORIO EUROPEO DI SPETTROSCOPIE NON LINEARI (LENS), Sesto Fiorentino (IT); ISTITUTO NAZIONALE DI RICERCA METROLOGICA (I.N.RI.M.), Turin (IT)

( * ) Notice: Subject to any disclaimer, the term of this patent is extended or adjusted under 35 U.S.C. 154(b) by 619 days.

(21) Appl. No.: 17/430,231

(22) PCT Filed: Feb. 11, 2020

(86) PCT No.: PCT/IB2020/051055
§ 371 (c)(1),
(2) Date: Aug. 11, 2021

(87) PCT Pub. No.: WO2020/165744
PCT Pub. Date: Aug. 20, 2020

(65) Prior Publication Data
US 2022/0131334 A1    Apr. 28, 2022

(30) Foreign Application Priority Data
Feb. 12, 2019 (IT) .............. 102019000002013

(51) Int. Cl.
*H01S 3/1055* (2006.01)
*H01S 5/02326* (2021.01)
(Continued)

(52) U.S. Cl.
CPC ........ *H01S 3/1055* (2013.01); *H01S 5/02326* (2021.01); *H01S 5/02415* (2013.01);
(Continued)

(58) Field of Classification Search
CPC .............. H01S 3/1055; H01S 5/02326; H01S 5/02415; H01S 5/02469; H01S 5/068; H01S 5/1039; H01S 5/143; H01S 5/042
See application file for complete search history.

(56) References Cited

U.S. PATENT DOCUMENTS 5,491,714 A * 2/1996 Kitamura .............. H01S 5/0687
372/102
5,579,327 A * 11/1996 Ohtateme ............... H01S 5/141
372/20
(Continued)

FOREIGN PATENT DOCUMENTS

CN       105591283         5/2016
DE       19509922 A1 *     9/1996    ........... H01S 3/1055
(Continued)

OTHER PUBLICATIONS

Machine translation of DE19509922A1 (Year: 1996).*
(Continued)

*Primary Examiner* — Yuanda Zhang
(74) *Attorney, Agent, or Firm* — Nixon & Vanderhye P.C.

(57) ABSTRACT

A laser device (100), comprising: a source of electromagnetic radiation (S) that comprises at least one reflecting surface (RS), said source (S) being configured to generate a light beam that follows an optical path (OPa; OP) external
(Continued)

to said source (S); a dispersive stage (6) located outside said source (S) along said optical path (OP) of said light beam generated by said source (S), said dispersive stage (6) comprising at least one axis of reflection that forms an angle (Θ; cp) with said optical path (OPa; OP) of said light beam and being configured to reflect: at least a first spectral portion of said light beam generated by said source (S) towards said source (S); and a second spectral portion of said light generated by the source (S) along said axis of reflection, wherein said at least one reflecting surface (RS) and said dispersive stage (6) form at least one variable-length external optical cavity (RS, L, 6); at least one collimating lens (C) located along said optical path (OPa; OP) and configured to collimate said light beam coming from said source (S); a collimator module (3), in which said source (S) and said at least one collimating lens (C) are mounted; and an actuator (24) configured to vary a length (L) of said a variable-length external optical cavity (RS, L, 6). In said device: said actuator (24) is mechanically coupled to said collimator module (3); and said actuator (24) is configured to vary the length (L) of said at least one external optical cavity of the variable-length gain medium (RS, L, 6) by moving said collimator (3).

19 Claims, 4 Drawing Sheets

(51) Int. Cl.
| | | |
|---|---|---|
| *H01S 5/024* | (2006.01) | |
| *H01S 5/068* | (2006.01) | |
| *H01S 5/10* | (2021.01) | |
| *H01S 5/14* | (2006.01) | |
| *H01S 5/042* | (2006.01) | |

(52) U.S. Cl.
CPC .......... *H01S 5/02469* (2013.01); *H01S 5/068* (2013.01); *H01S 5/1039* (2013.01); *H01S 5/143* (2013.01); *H01S 5/042* (2013.01)

(56) References Cited

U.S. PATENT DOCUMENTS

| | | |
|---|---|---|
| 5,982,794 A | 11/1999 | Tamura |
| 2004/0151214 A1 | 8/2004 | Syms |
| 2005/0105566 A1* | 5/2005 | Sacher .................... H01S 5/141 372/20 |
| 2008/0187268 A1 | 8/2008 | Kaneko et al. |
| 2016/0049768 A1 | 2/2016 | Hunter et al. |

FOREIGN PATENT DOCUMENTS

| | | |
|---|---|---|
| EP | 1 374 355 | 1/2004 |
| JP | S63-276288 A | 11/1988 |
| JP | 2008-193003 A | 8/2008 |
| JP | 2011-040627 A | 2/2011 |
| JP | 2012-523104 A | 9/2012 |
| JP | 2015-026860 A | 2/2015 |
| WO | 02/080319 | 10/2002 |
| WO | 2007/103569 A2 | 9/2007 |
| WO | 2011/081212 A1 | 7/2011 |

OTHER PUBLICATIONS

Office Action dated Aug. 29, 2023, issued in Japan Patent Application No. 2021-547341, 7 pages.
International Search Report and Written Opinion of the ISA for PCT/IB2020/051055 dated May 15, 2020, 12 pages.

* cited by examiner

EXTERNAL-CAVITY LASER DEVICE, CORRESPONDING SYSTEM AND METHOD

This application is the U.S. national phase of International Application No. PCT/IB2020/051055 filed Feb. 11, 2020 which designated the U.S. and claims priority to IT patent application Ser. No. 10/2019000002013 filed Feb. 12, 2019, the entire contents of each of which are hereby incorporated by reference.

TECHNICAL FIELD

The present disclosure relates to external-cavity laser devices. An example of such a device may, for instance, be an external-cavity laser (ECL) or a long-external-cavity laser (LECL).

One or more embodiments may be applied in contexts of optical spectroscopy of atoms and/or molecules and in metrological contexts.

TECHNOLOGICAL BACKGROUND

External-cavity lasers (ECLs), in particular those with diode lasers, referred to as external-cavity diode lasers (ECDLs), are a type of source of coherent radiation that may be stabilized in frequency.

For numerous and/or diverse applications, such as optical spectroscopy of atoms and/or molecules and metrology, the above lasers are called for:
 presenting characteristics of mechanical strength that will facilitate prolonged use thereof without any intervention on the side of external operators; and/or
 being tunable in frequency with respect to references.

The sources of radiation, also referred to as gain media or light sources, used in this type of device include, as mentioned, diode lasers, gain chips, but also other types of gain media, such as superluminescent LEDs (SLEDs), the latter being a gain medium configured to generate light via amplified spontaneous emission.

Both diode lasers and gain chips, as well as SLEDs, comprise, for instance, a semiconductor gain medium provided with at least one reflecting region, in particular a reflecting surface, for instance, on one of the two faces of the gain medium. This reflecting region may be obtained, for instance, by applying a reflecting treatment or else by (total or partial) internal reflection.

External-cavity laser devices and corresponding tunable systems conventionally comprise:
 a source of electromagnetic radiation (briefly, "light source" or "gain media") configured for generating and/or emitting a light beam; as mentioned, this source comprises, for instance, diode lasers, SLEDs, or so-called "gain chips"; in particular, these are configured for generating light mostly in the visible spectrum, the near ultraviolet, and the near and mid infrared. Such a source is included in an external optical cavity identified by at least one reflecting region, in particular a reflecting surface, thereof;
 a lens for collimating light emitted by the source;
 a spectral-selection optical element, which facilitates a frequency selection of the light beam, for example an optical filter or a diffraction grating, so as to obtain a laser emission at the target frequency; and
 an output coupler, comprising at least one reflecting element that supplies a light beam at output; this element may also coincide with the spectrally selecting optical element.

A variable-length external optical cavity, referred to, for brevity, as "external cavity", is hence defined between such a source of electromagnetic radiation and the spectral-selection optical element, in particular between the reflecting region of the source and the spectral-selection optical element. The resonant modes of the external optical cavity are currently known as longitudinal modes of the cavity.

Conventionally, at least one actuator is present, for example a piezo-electric actuator, that may be controlled electrically so as to enable variation of the length of the external cavity. The frequency of emission of the light of the laser is varied accordingly, as discussed in what follows.

Various types of external-cavity lasers are known and commonly used, which differ from one another, for instance, as regards a different choice of the output coupler and of the spectral-selection element.

A first type of configuration, referred to as the "etalon-like" configuration, uses an interference filter as spectral-selection means, while the output coupler comprises a mirror coupled to an actuator.

Use of the mirror renders the system mechanically stable and facilitates a low sensitivity to misalignments, in particular if a further lens that focuses the beam on the mirror is introduced. The interference filter (for instance, an etalon filter) is set within the external cavity, facilitating transmission of the incident light radiation only for a limited frequency range. This range may be varied by changing the angle between the normal to the etalon interference filter (that is, a direction perpendicular thereto) and a wave vector of the incident radiation, or else by varying the temperature at which the filter itself is set.

Use of a filter as element for spectral selection (that is, for frequency selection) presents some drawbacks, amongst which:
 a lack of temperature-stability: to obtain an emission on one and the same longitudinal mode for a prolonged period of time it is called for, in fact, precisely controlling the temperature of the interference filter; and
 a high value of absorption losses of the filter itself: such losses may be counterbalanced by a greater reflectivity of the output coupler mirror, at the cost of a reduction in the output power of the laser.

A second type of known configuration, referred to as the Littman-Metcalf configuration, uses both as spectral-selection means and as output coupler a system consisting of:
 a mirror mounted on a purposely provided support, provided in which is a piezo-electric actuator; and
 a diffraction grating.

Use of the Littman-Metcalf configuration as compared to use of an interference filter affords a reduced dependence of the spectrum of the output light beam upon temperature. In this type of configuration, a first diffraction order of the light beam is sent onto the mirror, which reflects the radiation again towards the grating, which in turn reflects it towards the source, thus forming an external optical cavity. However, on account of the dependence of the angle of reflection of the grating upon the radiation wavelength, only a limited range of spectral components (that is, frequencies) participates in laser emission.

In order to vary this range—and consequently the laser emission wavelength—it is mandatory to vary the angle between the diffraction grating and the wave vector of the incident radiation. This condition is implemented by varying the angle between the mirror and the diffraction grating, via rotation of a rotatable arm of the mirror support, for example an arm that is rotatable with respect to an external pivotal point. Output coupling is obtained by the radiation coming from the laser and reflected at zero order by the diffraction grating.

In the Littman-Metcalf configuration, furthermore, there are notable losses in the external cavity, mainly due to the radiation reflected by the mirror and in turn reflected at zero order by the grating. Such losses, once again as in the etalon-like configuration, lead to a reduction of the emission power of the laser.

In a third type of configuration, known as the Littrow configuration, a diffraction grating is used both as output coupler and as spectral-selection element, as discussed in the following in relation to FIG. 1.

In particular, in portion a) of FIG. 1, a first example of a configuration of a laser device of a Littrow type 100a comprises a light source S, a collimating lens C, and an output-coupler module 6ab, which comprises a spectral-selection element, in particular obtained via a diffraction grating 6a, as well as an actuator A. In a second example of the configuration of laser device of a Littrow type 100b, besides elements discussed in the foregoing with reference to structure 100a, the output-coupler module 6ab may comprise a diffraction grating 6a and a mirror 6b, which is, for instance, attached to the same support as that on which the diffraction grating 6a is mounted.

The mirror 6b is arranged so as to receive the beam reflected by the diffraction grating at an angle of orientation θ and to reflect it along an axis parallel to the optical axis of emission of the source S. The ensuing discussion regarding the Littrow configuration 100a applies in the same way to analogous elements in the Littrow configuration 100b.

The gain medium/source S, for example a diode laser, has at least one reflecting region RS, such a reflecting region RS (e.g., a connected region of space, such as a surface) being obtained in ways per se known. The source S is configured for emitting radiation (or visible light).

For instance, the gain medium S may be housed in a diode support.

A light beam generated/emitted by the source S follows an optical path OPa (100a) or OPb (100b) external to the source S, indicated with dashed lines in the figures. It is pointed out that by "source S" is meant, for instance, a diode laser and that the optical path OPa, OPb is external to the module that identifies the source S, in particular to the semiconductor junction and, if it is present, to the internal Fabry-Perot cavity, or else external to the package of the source S.

Located along such an optical path OPa, OPb there are:

the collimation lens C; and the output-coupler module 6ab, comprising the spectral-selection element, in particular the diffraction grating 6a.

The light beam emitted by the source S, once collimated with the lens C, impinges upon the diffraction grating 6a, which is hence also external to the light source S.

The actuator A, for example a piezo-electric actuator, is coupled to the grating 6a in the output-coupler module 6ab.

The reflecting region/surface RS of the source S and the diffraction grating 6a (which are located, for instance, at the ends of an optical axis passing through the collimation lens C) in the output-coupler module 6ab form at least one external cavity with variable length L.

A length L of the external cavity determines the wavelength λ of the light beam emitted by the source S, according to the formula $$\lambda = \frac{L}{n}$$

where n is an integer number.

The grating 6a, which operates as spectral-selection element in the output-coupler module 6ab, reflects at zero order the incident beam according to an axis, which forms an angle of orientation θ with the optical path of the light OPa, OPb.

The horizontal and vertical angles of orientation of the output coupler 6ab are such as to align the grating 6a in the module 6ab along the optical path OPa, OPb in such a way that a spectral portion of the light beam incident thereon, for example the first diffraction order, is back-reflected towards the light source S. In other words, a spectral portion of the beam incident on the grating 6a is propagated with an angle of 180° with respect to the direction of incidence. A remaining portion of the light beam at output, for example the zero-order reflected beam, proceeds along the optical path OPa, OPb.

A portion of light reflected towards the gain media/source S has a spectral component at at least one of the frequencies equal to the frequencies of the longitudinal resonant modes of the external optical cavity RS, L, 6a of length L. This condition generates a feedback network on the source itself, which facilitates regulation of the properties of emission only on the basis of the properties of the external cavity and no longer only on the basis of the characteristics of emission of the source S. It may be said that operation of the laser device 100a, 100b is in some way "dominated", or governed, by the properties of the external cavity rather than by those of the source S.

The angle of orientation θ is conventionally adjusted:

via one or more adjustment screws of the support (not visible), on which the output coupler 6ab that comprises the grating 6a is mounted; and/or via an electrical signal, for example processed by spectral analysis of the portion of light at output, sent to the piezo-electric actuator A that is mechanically coupled to the module 6ab.

As illustrated both in portion a) and in portion b) of FIG. 1, the actuator A via which to implement the variation of the angle θ of inclination of the grating 6a with respect to the direction of propagation of the light, that is, the optical path OPa, OPb, is mechanically coupled to the grating 6a, it being set within the output-coupler module 6ab, which comprises an adjustable base fixed with respect to the grating 6a. The fact that the piezo-electric actuator A is mechanically coupled to the module 6ab or to the grating 6a facilitates to change the angle θ between the normal to the diffraction grating 6a and the incident radiation. The wavelength λ of emission of the output beam may be adjusted by varying the angle of orientation θ of the diffraction grating 6a.

Hence, the Littrow configurations 100a, 100b present the advantage that there is no dispersion of light power and that a spectral-selection means 6a having a low dependence upon temperature is provided.

In certain cases, the actuator A is set within a mechanical support that supports the diffraction grating, in a purposely provided "fork-shaped" slot formed, for instance, by carving a recess in the material of which the support is made in order to house the actuator A. Also known in the prior art are other types of mechanical supports. Use of the Littrow configuration 100a, 100b requires that the support comprised in the output-coupler module 6ab will be designed with specific characteristics of elasticity to enable the actuator A to have a sufficiently extensive travel, albeit facilitating a high resolution of orientation, that is, of variation of the angle θ. Consequently, a drawback of the Littrow configuration 100a, 100b is the mechanical complexity of production required.

A drawback of an adjustment of the wavelength λ of emission as discussed in the foregoing lies, instead, in the fact that, during the variation of wavelength, a so-called "competition between modes" is enacted, for example mode hops of the system between the various resonance frequencies of the external cavity formed by the reflecting region RS and the spectral-selection element 6a.

Values of an overall gain, given by the combined product of gain of the source S, dispersion of the grating 6a, and resonant modes of the external cavity, may be comparable for adjacent/close modes (that is, frequencies) of the external cavity. A minor variation—obtained by the actuator A—in the angle of orientation θ of the grating 6a may bring the overall gain to be higher for a mode at a frequency close to the current mode of oscillation, thus causing the laser device 100a, 100b to hop to the mode with higher gain and lose stability in frequency of emission.

Hence, a configuration of a Littrow type 100a, 100b poses notably constrained conditions on the properties of the actuator A, which is called for providing notably fine adjustments and to present complex electro-mechanical settings.

A further drawback of the Littrow configuration 100a, 100b is that the variation of the angle θ of the grating also causes a variation of the range of frequencies diffracted by the diffraction grating 6a that participate in the laser radiation at output from the device. The fact that the motion of the piezo-electric actuator A has a dual effect on the laser—namely, that of varying the length L of the external cavity and that of varying the range of spectral selection of the diffraction grating 6a—may cause instability in the spectrum of emission due to mode hops.

This effect may be overcome by appropriately choosing a pivotal point/axis around which the diffraction grating 6a is rotated, this point/axis being chosen so as to be located in the plane of emission of the light radiation of the source S. Such a pivotal point of the spectral-selection element 6a of the output module 6ab is constrained to being positioned in a plane of emission of the source S. In this configuration 100a and 100b, the grating 6a must hence be mounted on a mechanical system that is sufficiently rigid—so as not to jeopardize the stability of the laser emission frequency on account of coupling of low-frequency mechanical noise—and that may be finely rotated θ so as to be able to control the laser emission frequency.

The presence of two concurrent technical parameters renders the system complex to produce from an opto-mechanical standpoint, and the laser sensitive to misalignment. These devices 100a, 100b and the corresponding opto-mechanical systems are hence characterized by an increased mechanical complexity, with the consequence of an increase in the costs of production of the laser and a reduced possibility of integrating the laser, for example within a more complex or portable device.

Again, a further drawback of carrying out adjustment of the wavelength in the Littrow configuration 100a lies in the fact that, by changing the angle of orientation θ of the grating 6a, also the direction of the output beam changes, limiting the applications thereof, for instance, to contexts in which the stability of pointing is not required. In particular, the Littrow configuration 100a does not present pointing stability as the frequency of emission varies in so far as a variation of the wavelength causes a variation of the angle of emission of the laser.

Such an effect may be reduced by reflecting the radiation emitted by the laser via a mirror fixed with respect to the support of the diffraction grating, rendering, however, mechanical realization of the laser increasingly more complex.

In the embodiment of the structure 100b, the mirror 6b coupled in a way attached to the grating 6a in the module 6ab facilitates to obtain an output light beam having a fixed axis of emission as the angle of orientation θ of the diffraction grating 6a varies, while presenting as a drawback, nevertheless, a rigid displacement of the direction of emission as a function of the angle of orientation θ.

A solution like the one discussed with respect to FIG. 1, in particular the solution 100a, is known, for instance, from document U.S. Pat. No. 7,970,024 B2.

Notwithstanding the vast activity in this field, as discussed in the foregoing further improved solutions are of interest.

OBJECT AND SUMMARY

An object of one or more embodiments is to contribute to providing such an improved solution.

According to one or more embodiments, the above object may be achieved by means of a device having the characteristics specified in the ensuing claims. An external-cavity laser device configured to be actuated at the source may provide an example of such a device.

One or more embodiments may regard a corresponding system. A tunable optical-laser system may provide an example of such a system.

One or more embodiments may regard a corresponding method.

One or more embodiments present the advantage of facilitating to obtain improved performances, for instance, a high mechanical/optical stability, along with a reduction of complexity of the components.

The claims form an integral part of the technical teaching provided herein with reference to embodiments.

BRIEF DESCRIPTION OF THE DRAWINGS

One or more embodiments will now be discussed, purely by way of example, with reference to the annexed drawings, wherein.

DETAILED DESCRIPTION OF EXAMPLES OF EMBODIMENTS

In the ensuing description, one or more specific details are illustrated in order to enable an in-depth understanding of examples of embodiments of the disclosure. The embodiments may be obtained without one or more of the specific details or with other methods, components, materials, etc. In other cases, known operations, materials, or structures are not illustrated or described in detail so that certain aspects of the embodiments will not be obscured.

Reference to "an embodiment" or "one embodiment" in the framework of the present description is intended to indicate that a particular configuration, structure, or characteristic discussed with reference to the embodiment is included in at least one embodiment. Hence, phrases such as "in an embodiment" or "in one embodiment" that may be present in one or more points of the present description not do not necessarily refer precisely to one and the same embodiment.

Moreover, particular conformations, structures, or characteristics may be combined in any adequate way any in one or more embodiments.

The references used herein are provided merely for convenience and hence do not define the scope of protection or the scope of the embodiments.

In the solutions discussed in the foregoing, it has been noted how, unless losses are caused in the optical path, it is not feasible to vary continuously the frequency of emission of the laser via the actuator, without varying pointing of the beam emitted by the device.

One or more embodiments facilitate to decouple mechanical stabilization of the arrangement in order to decouple pointing of the laser from its frequency stabilization.

Figure 2:
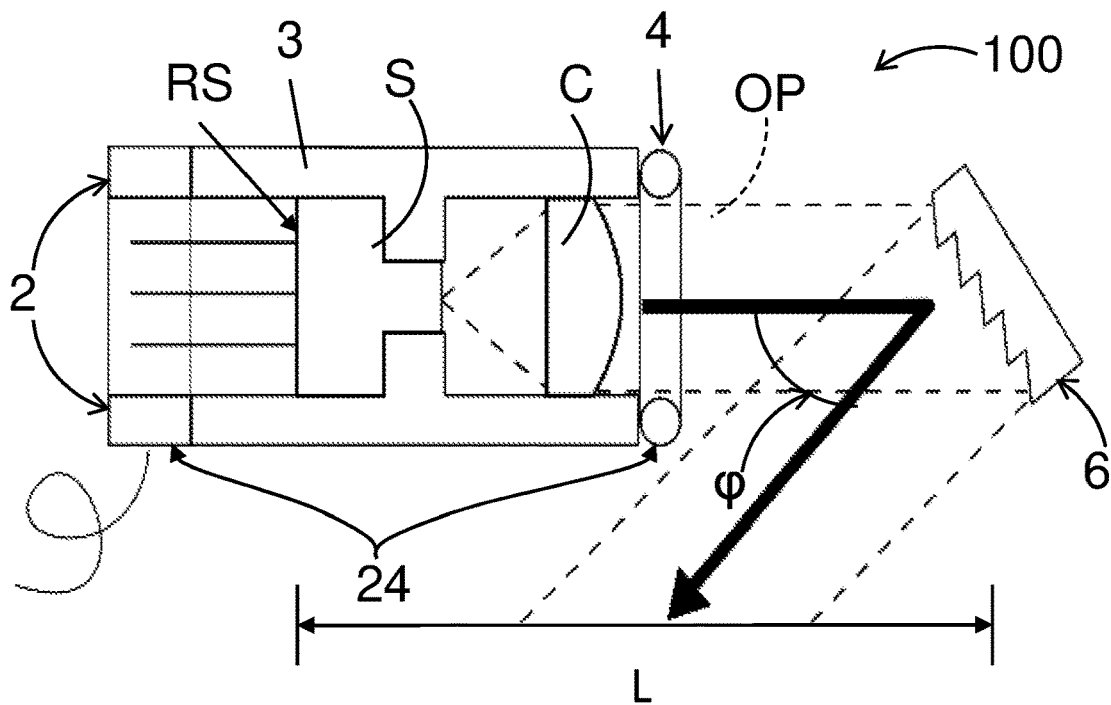
FIG. 2 is an exemplary optical diagram of one or more embodiments of the external-cavity laser device discussed herein.

In this regard, FIG. 2 shows an optical diagram, provided by way of example, of an embodiment of an external-cavity laser device 100, which is driven/actuated at the source S by a linear actuator mechanically coupled thereto, facilitating:

to reduce of the complexity of manufacturing mechanical components; and/or frequency and pointing stabilization.

Figure 1:
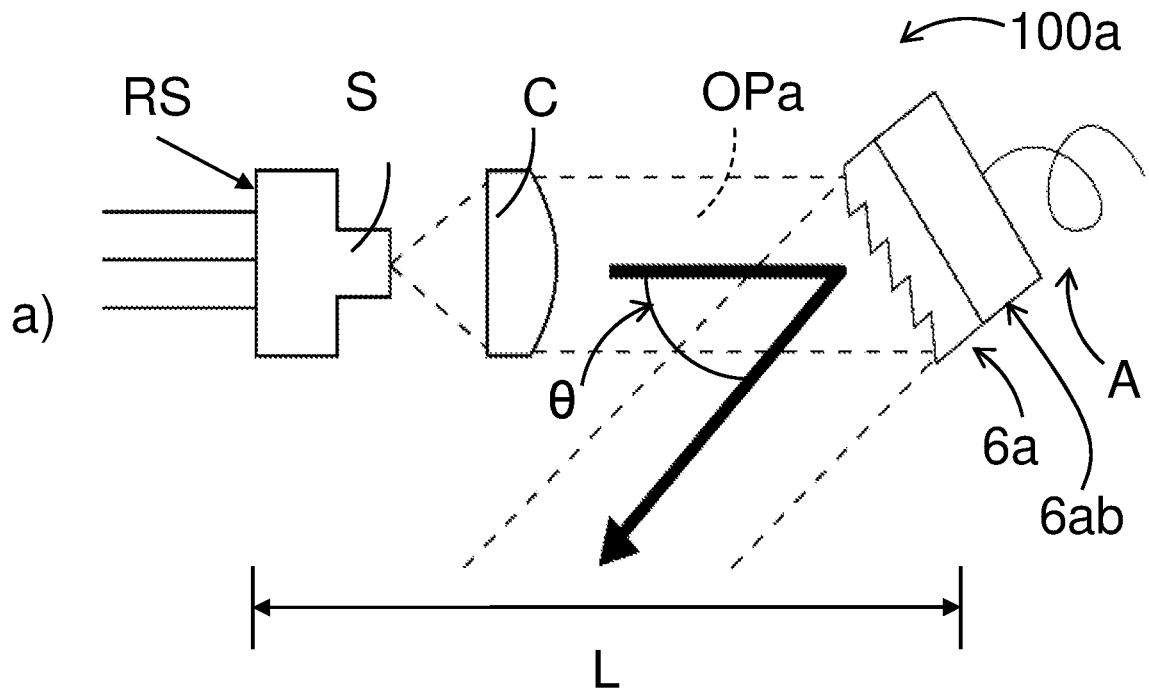
FIG. 1 has been discussed in the foregoing.
Figure 1:
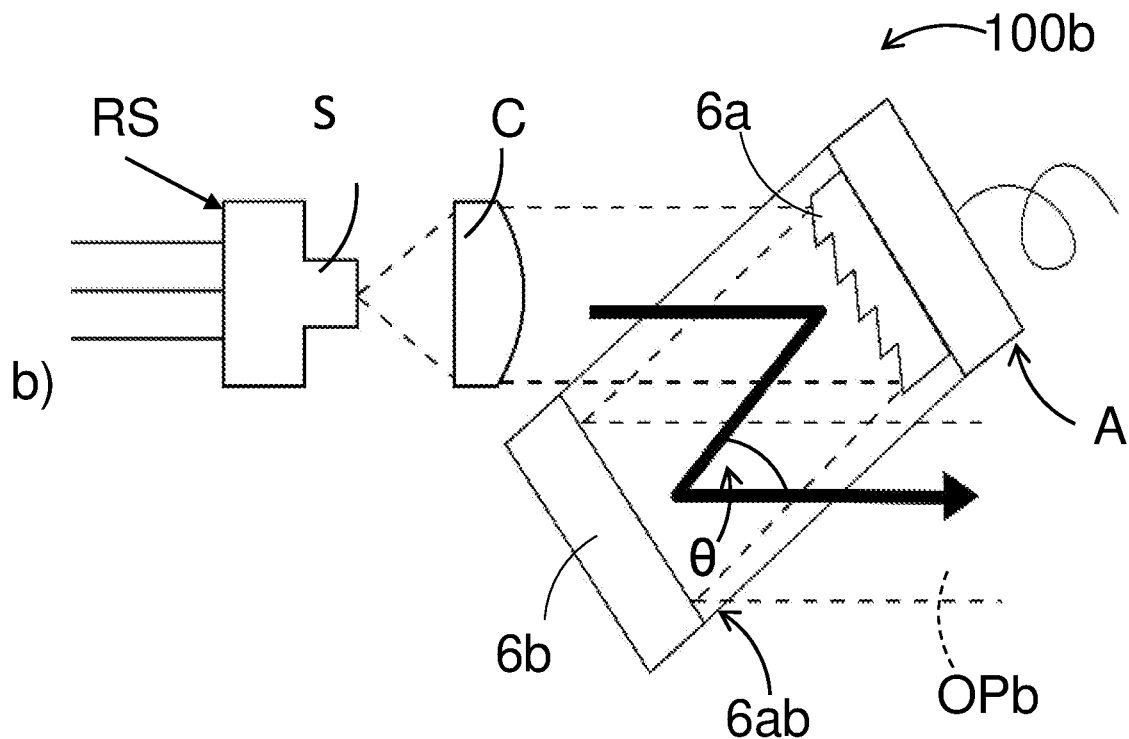

Once again, for the sake of simplicity, unless indicated otherwise, like-references are used in the following to designate like-parts as those of FIG. 1.

The external-cavity laser device 100, for example as exemplified in FIG. 2, comprises:

a linear actuator 24, comprising a variable-dimension element 2, that is, an element configured to change its dimensions at least along one axis upon reception of a command quantity, hence in particular a transducer element that transduces the command quantity into a linear movement; the variable-dimension element 2, in the example, is an element made of piezo-electric material; the linear actuator 24 moreover preferably comprises an elastic return element 4, for example an O-ring made of polymeric material or a mechanical spring, that is, an elastic element that is set on the element on which the actuator operates so as to exert an elastic force of reaction in a direction opposite to that of the force exerted by displacement of the variable-dimension element 2, thus facilitating ensuring stability thereof;

a collimator module 3, which comprises a source of electromagnetic radiation (also referred to briefly as "light source") S and at least one collimating lens C, which are mounted in the module 3; and a dispersive stage 6, for example an optical diffraction grating, which may be used both as spectrally selecting means and as output coupler.

The collimating lens C may comprise, for instance, an achromatic doublet, or any set of lenses, designed to collimate the light radiation emitted by the gain medium S.

The light source S and the collimating lens C, e.g., are assembled together in the collimator module 3, with the lens C set along the optical path OP of the light at output from the light source S so as to collimate such a light.

From an optical standpoint, the light source S produces a light beam and sends it to the collimating lens C in the collimator 3, by which it is collimated on/towards the diffraction grating 6; from here it is reflected at zero order at a static angle of orientation φ. In this case, in fact, the grating 6 is not associated to an actuator that changes orientation thereof, as in the case of the device 100a.

The linear actuator 24 is set upstream of the collimator module 3; in particular, set upstream of the collimator module 3 is the variable-dimension element 2 that transduces an electrical command signal into a linear displacement.

Figure 3:
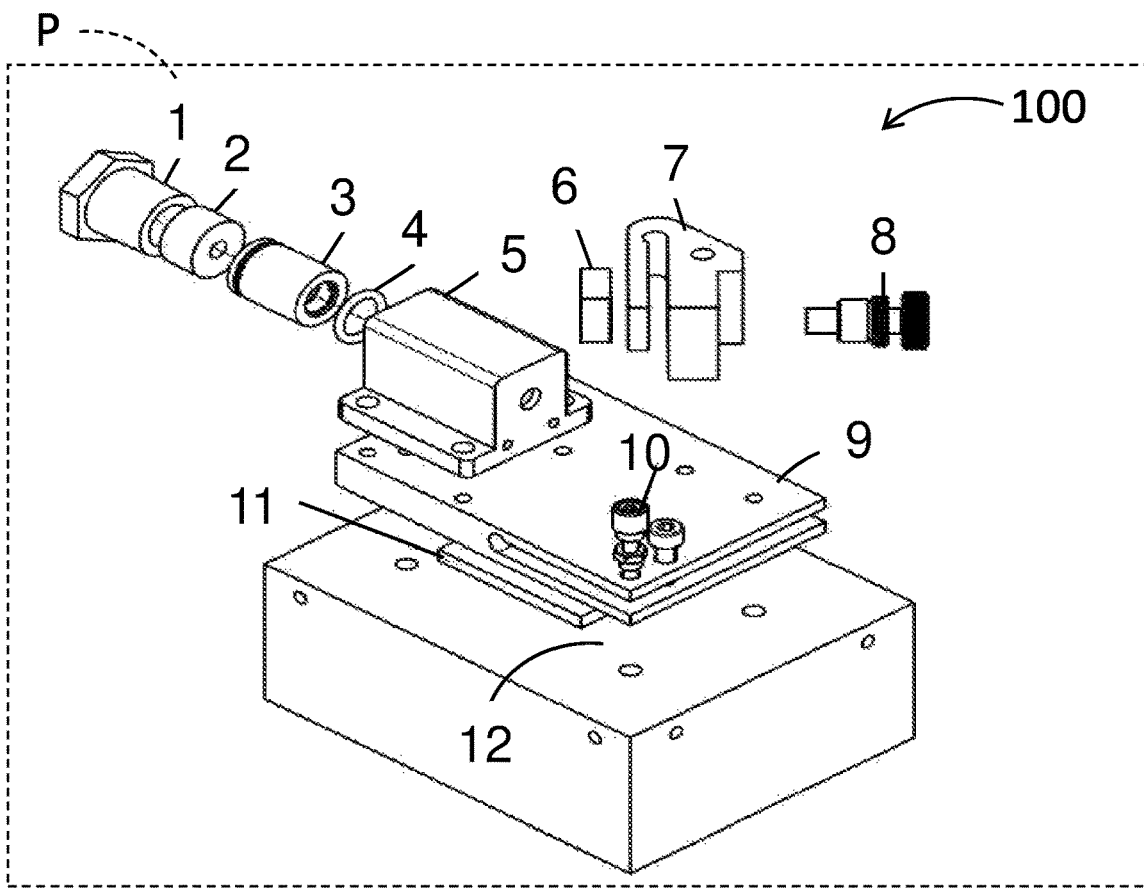
FIG. 3 is an exemplary exploded view of one or more embodiments of the device discussed herein.

Represented, instead, in FIG. 3 is an exploded view of the device 100, which facilitates to appreciate the mechanical structure thereof.

In the embodiment represented in FIGS. 2 and 3, at least one variable-length external optical cavity RS, L, 6 is defined between the source of electromagnetic radiation S and the dispersive stage 6.

The linear actuator 24 is mechanically coupled to the collimation module 3, for example to the light source S integrated therein, so as to move the source S and the lens C in the direction of an axis, in particular of the axis of emission of the source S, for example along an axis of the external cavity RS, L, 6.

The collimation module 3 comprises, in the example, a cylindrical collimator tube. In the linear actuator 24, the variable-dimension element 2, that is, the piezoelectric actuator, is coupled to a first surface (or facet) of the collimator module 3, for example on the side of the gain medium/source S, whereas the return element 4, in the example illustrated, is coupled to a second surface of the collimator module 3 and is located on the opposite side of the variable-dimension element 2 with respect to the source S, for example on the side of the lens C. It should be noted that the above arrangement of the elements of the linear actuator 24 is provided purely by way of example. Other examples of arrangement may envisage that the return element 4 is coupled to the first facet of the module 3, while the variable-dimension element 2 is coupled to the second facet of the module 3.

The elastic return element 4 (O-ring) may even not be present in the actuator 24 in so far as its absence does not jeopardize implementation, operation, or tunability via the variable-dimension element 2. A function of the return element 4 is to improve stability and reduce hysteresis of movement of the variable-dimension element 2.

In one embodiment, for example when the variable-dimension element 2 is coupled to the second facet of the module 3, the variable-dimension element 2 may have a shape that allows free passage of the light radiation therein; for instance, it may be shaped like a hollow cylinder.

Alternatively, a number of actuators may be used, for example formed by three variable-length elements 2 that have longitudinal axes set at angles, for example of 120°, with respect to one another, which may be coupled to the collimator module 3, thus favouring passage of cables without requiring the presence of holes in the actuators themselves.

A return element 4 suited for such a purpose may be any cylindrical element comprising elastic material, for example an O-ring made of polymeric material.

The elastic return element 4 co-operates with the extension or compression of the variable-dimension element 2, with consequent displacement of the collimator module 3. Specifically, the return element 4 exerts a force that opposes (that is, it acts in the opposite direction) the force exerted by the variable-dimension element 2, facilitating adjustment of the travel thereof.

It should be noted that the linear actuator 24 may be also obtained with other techniques per se known having alike dynamic and resolution conditions, not limited to linear actuators comprising piezo-electric material, as it may be appreciated by the person skilled in the sector. For instance, actuators of an electromagnetic type may be used, comprising magnets and coils operating along a displacement axis.

Hence, with reference, in particular, to the optical diagram of FIG. 2, in a way similar to what discussed in the foregoing in relation to the optical path OPa, OPb, the light emitted by the light source S in the device 100 propagates along an optical path OP, external to the source S, and impinges upon a surface of the dispersive stage, specifically of the diffraction grating 6. The grating 6, as anticipated, has at least one optical axis, for example an axis of reflection, which forms a static angle cp with the direction of propagation of the light from the source.

It is noted that, as the device 100 no longer calls for varying dynamically the static angle cp, for example via fine adjustment, the structure may have characteristics different from a structure of a Littrow type 100*a*, 100*b*. For instance, the mechanical support of the grating 6 used in one or more embodiments discussed herein does not require the presence of particular housings for the piezo-electric actuator or particular flexible materials. For instance, a conventional mirror holder may be used.

The external-cavity laser device 100 facilitates to obtain a light beam having a stable pointing direction. The dispersive stage, in the example the grating 6, is aligned so as to select the target frequency with an angle φ that may maintain one and the same value, that is, a constant angle, over a full range of frequencies or wavelengths selected by the grating, for example during a variation of the wavelength of emission via the linear actuator 24.

Specifically, the pivotal point of the rotating element of the dispersive stage 6 is no longer constrained to being positioned in the plane of emission of the gain medium/light source S. This further results in the possibility of reducing the overall dimensions of the laser device itself.

The static angle φ formed by the axis of reflection of the grating with the direction of propagation of the light beam, for example with the optical path OP, is hence chosen so as to determine, even only coarsely, the frequency of emission of the device 100, whereas fine adjustment of the frequency (or wavelength) is implemented via the linear actuator 24 that moves the collimator module 3.

An embodiment with a mechanical structure as exemplified in the exploded view of FIG. 3 facilitates to obtain a light beam (at output from the device 100) that is, for instance, spatially and temporally coherent, having a constant direction, that is, pointing stability, over a wide frequency range. As visible in FIG. 3, this embodiment comprises, as mentioned at least in part in the foregoing, the collimator module 3, the dispersive stage 6 comprising the diffraction grating, the linear actuator 24, and a supporting module 7, which are assembled on an adjustable base 9, which is provided with one or more adjustment screws 10, for example micrometric screws. The supporting module is provided with one or more adjustment screws 8, for example micrometric screws.

Once again, as mentioned, the collimator module 3 comprises, in the example, at its two ends, the light source S, for example a source of electromagnetic radiation, and at least one collimating lens C.

As discussed in the foregoing, the light source/gain media S, for example a diode laser, a diode laser with anti-reflection coating (gain chip), or a SLED, presents at least one region RS that is adequately reflecting. In particular, the light source may have a region (for instance, an area, a surface, or a corner or side) coated with an anti-reflection coating, in a way per se known. Substantially, the source S may have one, two, or more adequately reflecting regions RS.

Specifically, in the case of a source S such as a diode laser, the region RS is located in the proximity of the outer end of the gain medium/source S, that is, the end opposite to the surface of emission of the light beam.

In variant embodiments, such a reflecting region RS corresponds to at least one of the inner surfaces of an optical waveguide.

The source S is assembled together with its collimating lens C inside the collimator module 3, such a collimator module being set, for instance, between a piezo-electric transducer operating as variable-dimension element 2 and the O-ring made of polymeric material operating as elastic return element 4 within a mounting support 5.

The piezo-electric transducer 2, which moves the collimator module 3, for example along its axis of symmetry, brings about minor variations of the length L of the external cavity RS, L, 6 of the device 100, that is, the ECL device, which facilitates precise variations and corrections of the wavelength of the radiation, for example laser radiation, by varying the modes of the external cavity RS, L, 6. The O-ring 4 has the purpose of facilitating movement or guaranteeing stability of the variable-dimension element 2 of the linear actuator 24.

The collimator module 3 hence has the function of facilitating movement of one end on the side of the source S, that is, for instance, the reflecting region RS of the external cavity RS, L, 6, at the same time maintaining the target focal distance between the source and the collimator. The linear actuator 24 and the collimator module 3, as visible in FIG. 3, are shaped like a cylinder and fit into the correspondingly hollow housing of a diode support 5. Designated by reference 1 in FIG. 3 is a bushing, which is, for instance, connected to the threaded end of the diode support 5 that contains inside it the linear actuator and the collimator module 3, this bushing facilitating to hold together the ensemble of elements and, for instance, to pre-load the linear actuator 24. The elastic return element 4 associated to the second face of the collimator 3, in fact, bears upon the end wall of the cylindrical cavity of the support 5, exerting an elastic force that opposes the force exerted by the element 2. The element 4, such as a spring, may hence be pre-loaded in a certain way, facilitating adjustment of the range of variation of expansion of the piezo-electric element 2.

The support 5 or the piezo-electric actuator 2 may be perforated, for example with holes having a cylindrical shape, to enable the supply cables of the diode to exit from the support 5.

In one embodiment, the light source S may comprise a semiconductor diode laser with anti-reflection coating (gain chip) on the output surface, which emits light at 790 nm (1 nm=$10^{-9}$ m) produced at Eagleyard Photonics, Berlin, Germany. Notably, the laser device 100, in various embodiments, may operate with gain media and optical materials that enable operation thereof in different spectral ranges, for example from the near ultraviolet to the mid infrared, provided that a suitable source and suitable optical materials are available.

The collimating lens C, as mentioned, may comprise, for instance, an achromatic lens consisting of a doublet of lenses.

The linear actuator 24 is coupled to the light source S, which may be configured to emit coherent light. As mentioned, for instance, the source may be of the diode-laser type or of the SLED type.

The diffraction grating that, in the example discussed, implements the dispersive stage 6 operates both as spectrally selecting element and as output coupler. Such a grating 6 may, merely by way of example, be a holographic dispersive grating known by the tradename GH13-18V with a pitch of 1800 grooves per millimetre (1 millimetre=$10^{-3}$ m) manufactured at Thorlabs.

The linear actuator 24, as mentioned, is configured to move the collimator module 3 that may comprise the source of electromagnetic radiation S and the collimator lens C.

The linear actuator 24 may comprise, for instance, a ring piezo-electric actuator of the Piezosystem Jena HPSt 500/15-5/7 type.

Represented in FIG. 3 is a supporting module 7 for the grating 6, which is of a type similar to the mechanical support with fork-shaped slot used in the prior art for supporting the actuator of the grating in the Littrow configurations 100a, 100b. This is an example of possible mechanical support. In variant embodiments, the supporting module 7 may, for instance, be a simple mirror holder. Overall, in further embodiments, the supporting module 7 may also be obtained in a different way. In one or more embodiments, the gain medium S and the lens C, as likewise the collimator 3, may be integrated within the linear actuator 24, for example to form a single/integrated module.

In one or more embodiments, the collimator module 3 may comprise, merely by way of example, a collimator tube of the type known by the tradename Thorlabs LT230P-B.

As further visible in the exploded view of FIG. 3, the grating 6 is attached on a supporting module 7 having a rotatable arm, in such a way that the axis of reflection of the grating 6 forms a static angle φ with the direction of propagation of the light. Such an angle φ may be selected by moving the micrometric screw 8. This facilitates selection of the wavelength with a spectral resolution based on the properties of the grating, as discussed in the foregoing.

Supports 5, 7 of the source S (e.g., diode) and of the grating 6 are mounted on the base 9, which is optionally adjustable, for instance, via micrometric screws 10. In this variant, the part of the base 9 where the support 7 for the grating 6 is attached may be bent via two screws 10. Vertical alignment of the beam reflected by the grating (for instance, towards the source S) may be obtained by regulating bending of part of the base 9 obtained via at least two screws 10 that work in opposition to push and pull the two opposite sides of the base.

A Peltier cell 11, mounted on a block 12, which is, for instance, made of aluminium and operates as heat sink. It may be used to stabilize the temperature of the base 9 and of the head of the gain media/source S with a control unit or control circuit.

The light beam emitted by the laser device 100, for example in this embodiment, has a low dependence upon temperature, and the frequency of emission may be locked to a reference by adjusting the length L of the external optical cavity RS, L, 6 itself, maintaining the position (for instance, the static angle φ) of the diffraction grating 6 stable and hence without varying the angle of emission. Once the diffraction grating 6 is aligned to select the frequency of emission of the device 100, the laser 100 hence presents a stable pointing φ.

In a variant embodiment, the dimension of the external cavity RS, L, 6 is greater than or equal to 10 cm (1 cm=$10^{-2}$ m); that is, it is an LECL configuration.

Use of embodiments as discussed in the foregoing, in particular in relation to FIG. 2, in an LECL is particularly advantageous because it facilitates to extend the range of frequencies on which the device may operate in the absence of mode hops. In fact, in a Littrow configuration, the dynamic range of variability of the actuator A of the grating 6a required to guarantee that the pivotal point will be located in the plane of emission may be complex and burdensome to provide, both mechanically and optically.

In a variant embodiment, the device 100 may be mounted within a protective casing P, made for example of PVC or Plexiglas.

Figure 4:
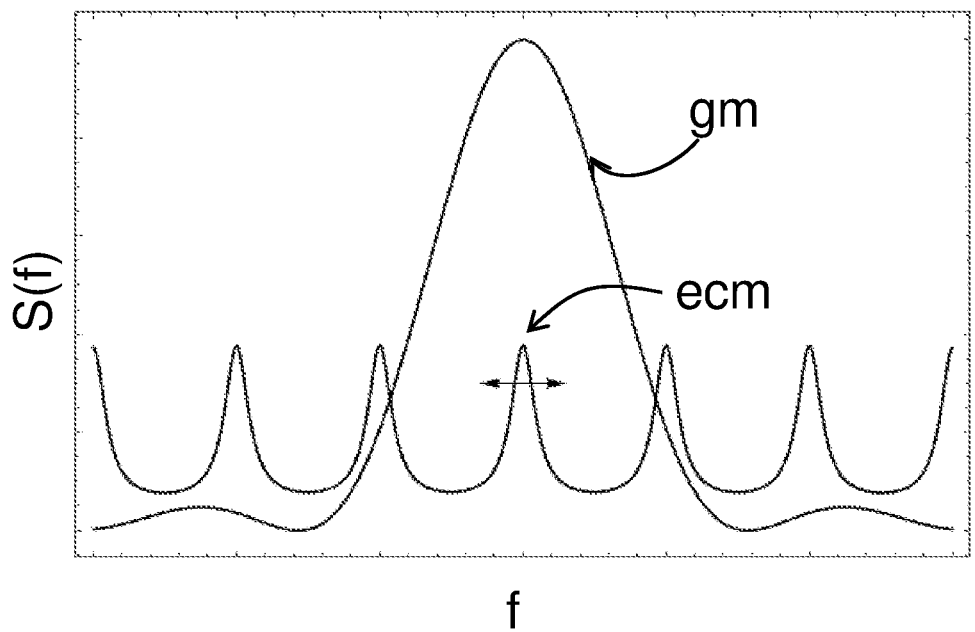
FIG. 4 is an exemplary diagram of a frequency spectra in one or more embodiments of the device discussed herein.

The external-cavity device 100 may have a behaviour in frequency as represented in the diagram of FIG. 4.

The horizontal axis f of the abscissae indicates a range of frequencies f, while the vertical axis of the ordinates S(f) indicates magnitudes of frequency spectra. A first curve gm represents the spectrum of the dispersive stage 6 (grating-mode profile), while a second curve ecm represents the spectrum of the (resonant) modes of the external cavity RS, L, 6 (external-cavity modes), varying as a function of the length L of the cavity itself. In a device 100a, 100b of a Littrow type both a respective grating-mode profile and respective external-cavity modes are shifted, for example displaced, in frequency f by the action of the piezo-electric actuator A coupled to the module 6ab, whereas in one or more embodiments of the long-cavity laser device 100 only the external-cavity modes are shifted/changed by the action of the linear actuator 24, for example of the variable-length element 2, while the grating-mode profile is based on the selection of the static angle cp, for example changed manually via the adjustment screws set on the grating holder 7.

Consequently, a dispersive spectrum gm of such a diffraction grating that exemplifies the dispersive stage 6 of the device 100 is independent of the variation of the length L of the variable-length external optical cavity RS, L, 6 insofar as the dispersive spectrum depends upon the static angle φ formed by one of the axes of reflection of the grating 6 with the direction of propagation of the light beam. Furthermore, at the same time, the resonance spectrum ecm varies as a function of a single geometrical parameter of the external cavity RS, L, 6, that is, as a function of the length L of the variable-length external optical cavity RS, L, 6.

Figure 5:
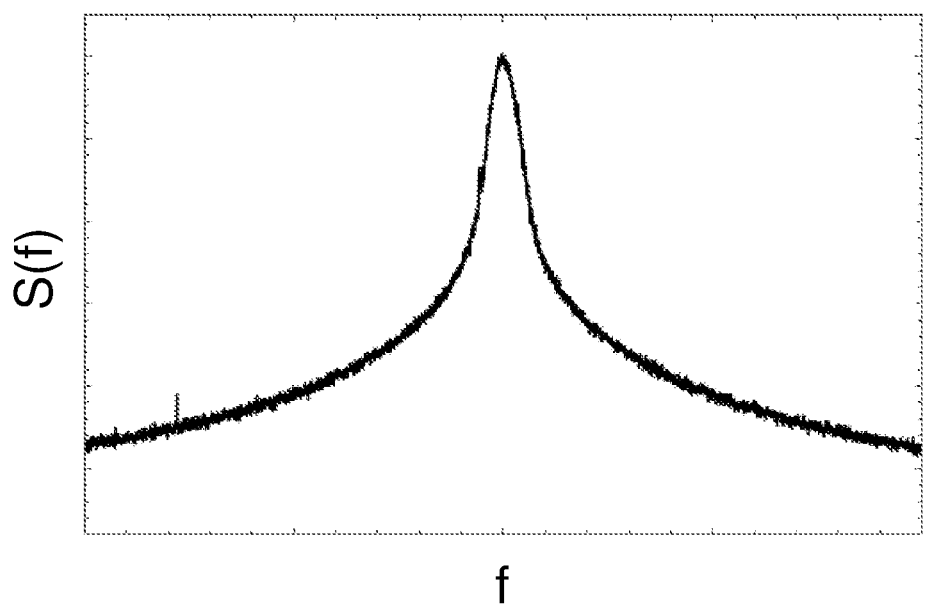
FIG. 5 is an exemplary diagram of a spectrum of emission of one or more embodiments of the device discussed herein.

FIG. 5 shows a diagram of the spectrum of emission of one or more embodiments of the external-cavity laser device 100, as exemplified in FIGS. 2 and 3.

FIG. 5 represents on the horizontal axis of the abscissae f a range of frequencies in arbitrary units and on the axis of the ordinates the light intensity when a Littrow configuration device and an external-cavity laser device like the one discussed with reference to FIGS. 2 and 3 are frequency-locked, in an independent way, to a saturation-spectroscopy signal from a rubidium cell via a slow feedback to the piezo-electric transducer (with band <15 Hz). The feedback counters slow variations of the frequency of the two lasers due to variations in temperature or variations of some other nature. The frequency spectrum of the signal representing beating between the two (independent) lasers, as shown in FIG. 5, results in a line width for the single laser that is comparable, once again by way of example, to line widths obtained with previous designs of frequency-locked ECLs in a Littrow device 100a, 100b.

Figure 6:
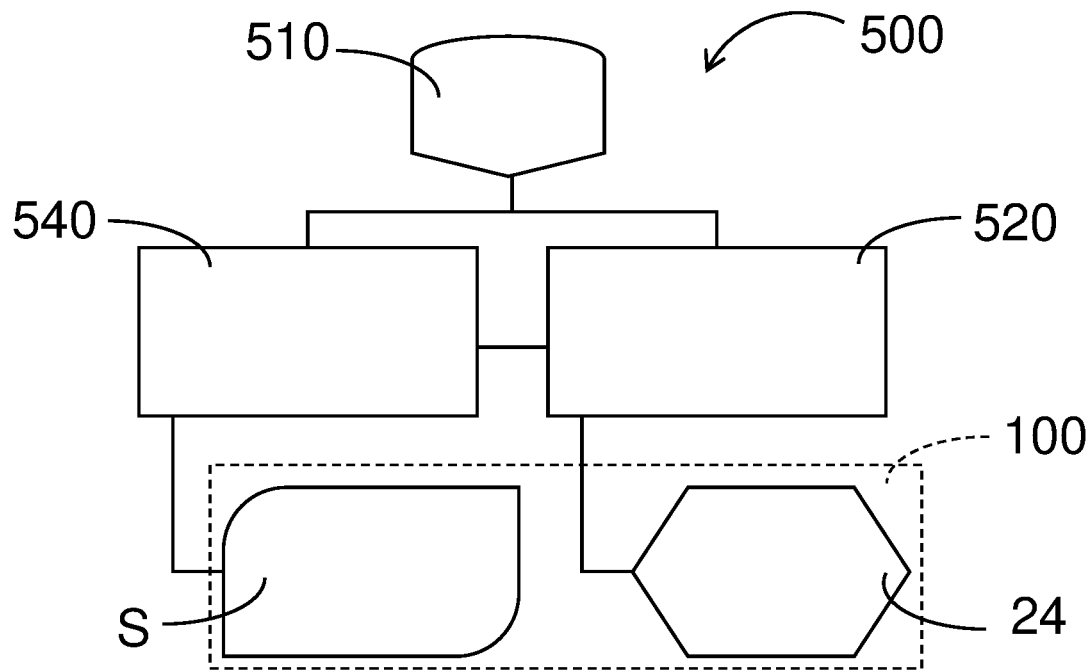
FIG. 6 is an exemplary diagram of a tunable optical-laser system according to one or more embodiments.

One or more embodiments comprise a corresponding system 500, as exemplified in FIG. 6.

The device 100 may be set in a laser optical system 500 that may be tuned in an automatic way, where the wavelength (or frequency) of emission of the device 100 may be locked to a reference in a feedback network that facilitates variation of the dimension, for instance, the length L, of the external cavity RS, L, 6 itself, maintaining the orientation φ of the grating 6 constant, as discussed in what follows, for instance, in relation to FIG. 6.

The system 500, as shown for example in FIG. 6, may comprise:
- a laser device such as, for instance, the external-cavity laser device 100 discussed in the foregoing;
- a power-supply source 540, which may be coupled to said optical device 100 and is configured to supply the light source S present in the optical device 100;
- a control unit 520 coupled to the actuator 24, configured to operate on a feedback signal (for instance, for processing it and/or supplying it and/or using it as drive), for example a signal of error with respect to a target behaviour of the device 100, for instance, a mismatch in the value of frequency provided at output; optionally, the control unit 520 may be coupled both to the actuator 24 and to the power-supply source 540 that powers the light source S;
- a configuration interface 510, for example a graphic interface of a software, configured to provide information on how to carry out power supply of the gain media S and to drive the linear actuator 24 of the device 100 via the control unit 520; and
- optionally, a safety interlock, configured to decouple the power-supply source 540 from the device 100 and/or to drive the control unit 520 in order to decouple the power-supply source 540 from the device 100; by way of example, the control unit 540 may comprise a controller known under the tradename Thorlabs LDC8002 manufactured by Thorlabs.

In one or more embodiments, for a system comprising an ECL (and/or LECL) device 100, the power-supply source 540 may be driven, for instance, via the control unit 520 so as to operate as a further regulator on the device 100, for example by carrying out a further current regulation that may hence regulate the supply current, for example supplied by the power supply 540 of the light source S, so as to facilitate to maintain stability of the output frequency of the light emitted by the external cavity RS, L, 6 of the device 100. In addition to this, in variant embodiments, the control unit 520 may also be configured to drive the power supply 540 so as to vary the current of the source S during a frequency sweep may simultaneously with variation of the linear actuator 24, as discussed in the following.

The linear actuator 24 may receive from the control unit 520 a feedback signal and convert a portion of the spectrum of the feedback signal supplied by the control unit 520 into movement, for example based on the value of a cut-off frequency of its own, in such a way that the actuator 24 is activated at/responds to the frequencies below such a cut-off value. The power-supply source 540 that powers the radiation source S may, alternatively, be driven via signals with a (frequency) band that comprises frequencies higher than that of the linear actuator 24. From the foregoing it follows that the feedback signal supplied by the control unit 520 may be used for driving the power-supply source 540 to correct or regulate the behaviour of the device 100, in the case where it is effective to carry out a faster adjustment than the one obtained via the linear actuator 24. In one or more embodiments, the linear actuator 24 has an adequate cut-off frequency to respond to the spectral components of the feedback signal coming from the control unit 520 that enable compensation of temperature variations and/or low-frequency acoustic and mechanical noise (for instance, with a frequency of less than 10 kHz), whereas the power-supply source 540 that powers the radiation source S facilitates fine correction of errors or correction of further sources of error in addition to the ones already discussed. The feedback signal may hence be shared between the actuator and the power supply according to various strategies, for example according to different spectral partitions, taking into account the cut-off frequency of the actuator.

Such an arrangement has the purpose of facilitating reduction of the spectral line width of the radiation emitted by the external-cavity laser device 100.

Figure 7:
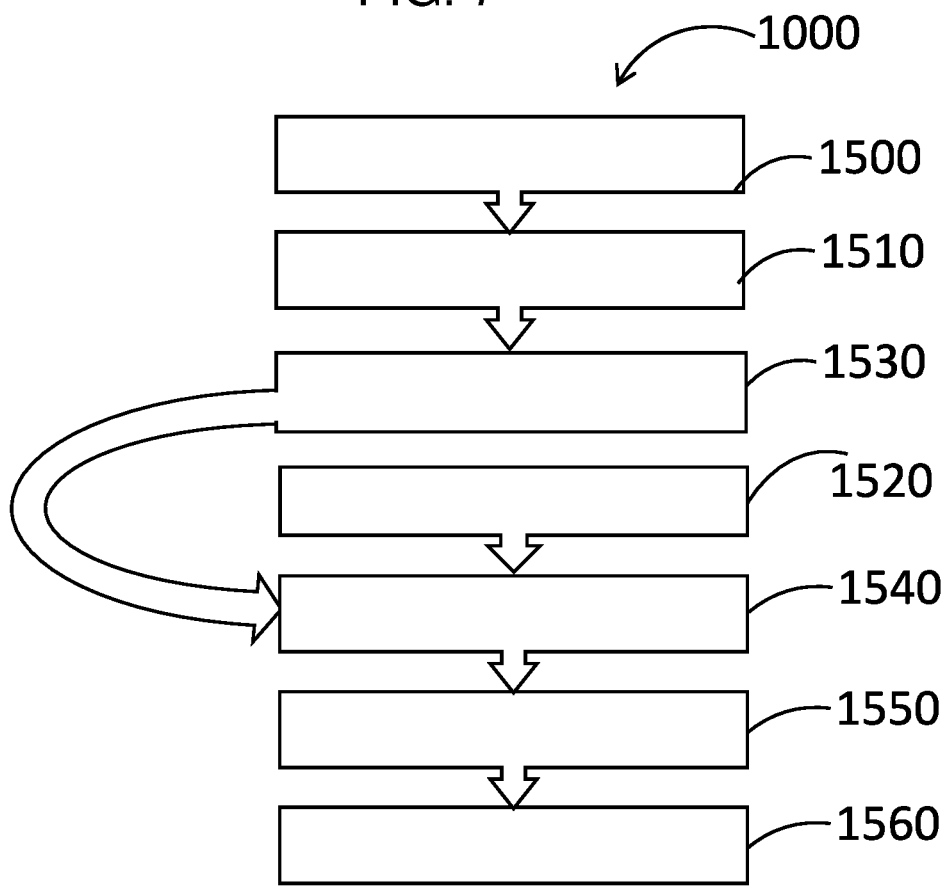
FIG. 7 is a diagram provided by way of example of a laser-tuning method according to one or more embodiments.

FIG. 7 shows a diagram representing operations of a method 1000 implemented via the system 500 and via the device 100 discussed. With reference to the figure, it comprises:
- providing a tunable optical-laser system 500 as discussed in the foregoing;
- selecting a static angle φ formed by the axis of reflection of the dispersive stage 6 with the optical path OP of propagation of the light from the source S;
- providing 1520 a frequency reference, in a way per se known, for example a frequency reference from a stable optical cavity, a stable laser radiation, or a spectroscopy signal (for instance, obtained via an absorption spectroscopy system) from an atomic or molecular sample that provides a signal representing a certain reference spectrum;
- producing 1530 a light beam via such a system 500;
- performing a comparison 1540 of the light beam with such a reference signal;
- providing 1550 to such a control unit 520 of such a system 500 a signal representative of such a performed comparison; and
- varying 1560 the dimension, for example the length L, of the external cavity RS, L, 6 as a function of such a signal indicating the comparison, for example in an iterative way.

The method may also comprise, in variant embodiments, performing, together with, or as an alternative to, the method 1000, a variation of the supply current 540 of the source S in the system 500.

It is noted that the order of the acts illustrated in the diagram of FIG. 7 is provided purely by way of example, but may also be different. For instance, the act 1520 of providing the frequency reference and the act 1530 of generating the beam may be carried out at the start of the method or prior to act 1510.

Consequently, in this framework, one or more embodiments of the laser-tuning method 1000, comprise, for instance, the operations of:

using 1500 such a tunable optical-laser system 500;
selecting 1510 an angle φ formed by said at least one axis of reflection in the dispersive stage 6 with said optical path OP of said light beam coming from the source of electromagnetic radiation S;
performing a comparison 1540 of signals indicating such a light beam 530 with signals indicating such a frequency reference 1520 provided to the system 500;
providing 1550 to such a control unit 520 of such a system 500 a signal indicating such a performed comparison 1540; and
iteratively varying 1560 such a length L of such an at least one external cavity RS, L, 6 as a function of such a signal representing such a comparison 1550 via moving 24 such a source of electromagnetic radiation S as a function of said signal indicating such a comparison 1550.

Without prejudice to the underlying principles, the details and embodiments may vary, even considerably, with respect to what has been discussed purely to way of example, without thereby departing from the sphere of protection of the invention, which is defined by the annexed claims.

The invention claimed is:

1. A laser device, comprising:
a source of electromagnetic radiation, configured to generate a light beam that follows an optical path external to said source;
a dispersive stage located outside said source along said optical path of said light beam generated by said source, said dispersive stage comprising at least one axis of reflection that forms an angle with said optical path of said light beam and being configured to reflect:
at least a first spectral portion of said light beam generated by said source towards said source, and
a second spectral portion of said light generated by the source along said axis of reflection,
wherein at least one variable-length external optical cavity is defined between said source of electromagnetic radiation and said dispersive stage;
at least one collimating lens, set along said optical path and configured to collimate said light beam coming from said source; and
a collimator module, in which said source and said at least one collimating lens are mounted; and
an actuator configured to vary a length of said at least one variable-length external optical cavity,
wherein:
said actuator is mechanically coupled to said collimator module; and
said actuator is configured to vary the length of said at least one variable-length external optical cavity via moving said collimator, and
said angle that the at least one axis of reflection of said dispersive stage forms with said optical path of said light beam is constant during a variation of the length of said at least one variable-length external optical cavity via said actuator.

2. The device according to claim 1, wherein said source comprises at least one reflecting region, said at least one variable-length external optical cavity being defined between said at least one reflecting region and said dispersive stage.

3. The device according to claim 1, wherein said actuator comprises a variable-length element associated to one of the ends of the collimator.

4. The device according to claim 3, wherein said variable-length element comprises a piezo-electric actuator.

5. The device according to claim 3, wherein said variable-length element is geometrically configured to allow passage of the light beam coming from the source, in particular being shaped like a hollow cylinder.

6. The device according to claim 3, wherein said actuator comprises an elastic return element associated to the collimator so as to apply an elastic force to the collimator that opposes a force applied by the variable-length element.

7. The device according to claim 1, wherein said actuator comprises a plurality of linear piezo-electric actuators.

8. The device according to claim 1, wherein said dispersive stage is configured to deflect said second spectral portion of said light generated by the source directly at output from the device in a constant direction as the frequency of said first spectral portion and/or said second spectral portion varies.

9. The device according to claim 1, wherein said dispersive stage is coupled to an adjustable support, said adjustable support being:
configured to be orientable on an axis of rotation and/or displacement; and
provided with at least one adjustable screw, which is configured to align the adjustable support of said dispersive stage with the source.

10. The device according to claim 1, wherein it further comprises:
a base, a heat sink, and a Peltier element;
and wherein:
said base comprises a support and/or one or more adjustment screws and is configured to be coupled to at least one from among said source, said actuator, and said one or more adjustment screws; and
said Peltier element is configured to be set between said base and said heat sink.

11. The device according to claim 1, wherein said source comprises, alternatively:
a diode laser; or
a gain chip; or
a superluminescent LED-SLED.

12. A tunable optical-laser system comprising:
an external-cavity laser device according to claim 1;
a power-supply source, couplable to said external-cavity laser device and configured to supply said source of electromagnetic radiation located in the external-cavity laser device; and
a control unit coupled at least to said actuator.

13. A laser tuning method, comprising:
using the tunable optical-laser system according to claim 12;
selecting an angle formed by said at least one axis of reflection in the dispersive stage with said optical path of said light beam coming from the source of electromagnetic radiation;
performing a comparison of signals representing said light beam with signals representing a frequency reference that is provided to the system;
providing to said control unit of said system a feedback signal indicating said comparison; and
iteratively varying said length of said at least one external cavity as a function of said signal indicating said comparison by moving said source of electromagnetic radiation as a function of said feedback signal indicating said comparison.

14. The device of claim 1, wherein said second spectral portion of said light beam generated by the source is reflected at zero order by said dispersive stage.

15. The device of claim 1, wherein said actuator is configured to vary the length of said at least one variable-length external optical cavity via moving said collimator during tuning the frequency of said light beam.

16. The tunable optical-laser system according to claim 12, wherein:
    said control unit is further coupled to the power-supply source;
    said external-cavity laser device is frequency-locked to a frequency reference provided to the tunable optical-laser system in a feedback network via a feedback signal provided by the control unit to the actuator and/or to the power-supply source.

17. The laser tuning method according to claim 13, comprising:
    converting a first portion of the spectrum of the feedback signal into movement based on the value of a cut-off frequency of the actuator, and
    converting a second portion of the spectrum of the feedback signal for driving the power-supply source to regulate a current supplied to said source of electromagnetic radiation located in the external-cavity laser device,
    wherein the actuator responds to frequencies below the cut-off frequency value.

18. The laser tuning method according to claim 17, wherein the cut-off frequency value of the actuator is lower than 10 kHz or lower than 15 Hz.

19. The device according to claim 10, wherein it further comprises a protective casing.

\* \* \* \* \*